(12) United States Patent
Racz et al.

(10) Patent No.: US 9,547,024 B2
(45) Date of Patent: Jan. 17, 2017

(54) DEVICE FOR CURRENT MEASUREMENT

(71) Applicant: Melexis Technologies NV, Tessenderlo (BE)

(72) Inventors: Robert Racz, Zug (CH); Mathieu Ackermann, Lausanne (CH); Jian Chen, Heist op den Berg (BE)

(73) Assignee: Melexis Technologies NV, Tessenderlo (BE)

( * ) Notice: Subject to any disclaimer, the term of this patent is extended or adjusted under 35 U.S.C. 154(b) by 190 days.

(21) Appl. No.: 14/264,635

(22) Filed: Apr. 29, 2014

(65) Prior Publication Data

US 2014/0333301 A1 Nov. 13, 2014

(30) Foreign Application Priority Data

May 7, 2013 (CH) ........................... 0924/13
Jun. 17, 2013 (CH) ........................... 1130/13

(51) Int. Cl.
*G01R 33/07* (2006.01)
*G01R 19/00* (2006.01)
*G01R 15/20* (2006.01)

(52) U.S. Cl.
CPC ........... *G01R 19/0092* (2013.01); *G01R 15/20* (2013.01); *G01R 33/07* (2013.01); *G01R 15/207* (2013.01)

(58) Field of Classification Search
CPC ...... G01R 19/0092; G01R 33/07; G01R 33/06
See application file for complete search history.

(56) References Cited

U.S. PATENT DOCUMENTS

| 4,937,521 | A |   | 6/1990  | Yoshino et al. |
|-----------|---|---|---------|----------------|
| 5,075,759 | A | * | 12/1991 | Moline ................... H01L 23/66 257/692 |
| 5,942,895 | A | * | 8/1999  | Popovic ................ G01R 1/07 324/117 H |
| 6,040,690 | A | * | 3/2000  | Ladds ................... G01R 21/08 324/117 H |

(Continued)

FOREIGN PATENT DOCUMENTS

| JP | 2003302428 A | 10/2003 |
| JP | 2008298761 A | 12/2008 |

(Continued)

*Primary Examiner* — Huy Q Phan
*Assistant Examiner* — Alvaro Fortich
(74) *Attorney, Agent, or Firm* — McCormick, Paulding & Huber LLP

(57) ABSTRACT

A device for current measurement comprises a substrate with a first current conductor and a current sensor with a second current conductor. The current sensor is mounted above the first current conductor on the substrate. The second current conductor is formed with integrally attached first and second terminal leads through which the current to be measured is supplied and discharged. The current sensor further comprises a semiconductor chip with a magnetic field sensor mounted on the second current conductor on the side of the second current conductor facing the substrate. The magnetic field sensor is sensitive to a component of the magnetic field extending parallel to the surface of the semiconductor chip and perpendicular to the second current conductor. The second current conductor extends above and parallel to the first current conductor.

21 Claims, 3 Drawing Sheets

(56) References Cited

U.S. PATENT DOCUMENTS

Figure 2:
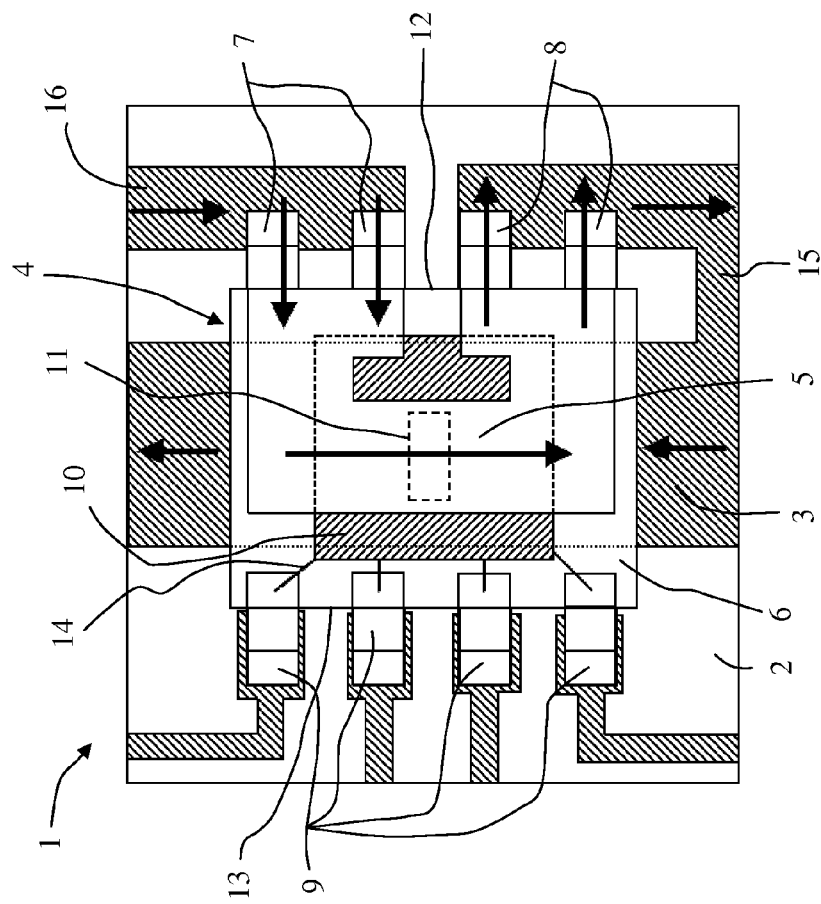

| | | | |
|---|---|---|---|
| 7,129,691 B2 | 10/2006 | Shibahara et al. | |
| 7,166,807 B2 * | 1/2007 | Gagnon | H01L 24/40 174/536 |
| 7,375,507 B2 * | 5/2008 | Racz | G01R 15/207 324/117 H |
| 7,816,905 B2 * | 10/2010 | Doogue | G01R 15/207 324/117 H |
| 9,389,247 B2 * | 7/2016 | Ausserlechner | G01R 15/207 |
| 2004/0155644 A1 | 8/2004 | Stauth et al. | |
| 2005/0030018 A1 * | 2/2005 | Shibahara | G01R 15/202 324/251 |
| 2005/0134254 A1 * | 6/2005 | Roden | G01R 1/203 324/126 |
| 2006/0202692 A1 | 9/2006 | Tatschl et al. | |
| 2007/0063690 A1 * | 3/2007 | De Wilde | G01R 15/20 324/117 R |
| 2008/0084205 A1 | 4/2008 | Zimmer | |
| 2010/0156394 A1 | 6/2010 | Ausserlechner et al. | |
| 2010/0211347 A1 | 8/2010 | Friedrich et al. | |
| 2012/0081110 A1 * | 4/2012 | Racz | G01R 15/202 324/252 |

FOREIGN PATENT DOCUMENTS

| | | | |
|---|---|---|---|
| WO | 2005026749 A1 | 3/2005 | |
| WO | 2006130393 A1 | 12/2006 | |

* cited by examiner

DEVICE FOR CURRENT MEASUREMENT

PRIORITY CLAIM

Applicant hereby claims foreign priority under 35 U.S.C §119 from Swiss Patent Application No. 924/13 filed May 7, 2013 and from Swiss Patent Application No. 1130/13 filed Jun. 17, 2013, the disclosures of which are herein incorporated by reference.

FIELD OF THE INVENTION

The invention concerns relates to a device for current measurement.

BACKGROUND OF THE INVENTION

Current conductors are available in many configurations and variants. Current sensors, which detect the magnetic field generated by the current, are packed in a conventional IC housing and in which the current conductor through which the current to be measured flows is guided through the housing, are known for example from U.S. Pat. No. 7,129,691, WO 2005026749, WO 2006130393 and US 2010156394. Such current sensors contain a current conductor which is arranged as a part of the leadframe, which is used for mounting and producing the electrical terminals, and a semiconductor chip mounted on the leadframe, which chip comprises at least one magnetic field sensor and the electronics required for its operation and for the processing of its output signal.

Furthermore, current sensors which are encased in a conventional IC housing are also known, e.g. from JP 2003302428, which are mounted on a printed circuit board above a conducting path and which measure the current flowing through the conducting path.

SUMMARY OF THE INVENTION

A device for current measurement in accordance with the invention comprises
a substrate with a first current conductor, and
a current sensor with a second current conductor, wherein
the current sensor
is encased in an IC housing and is mounted above the first current conductor on the substrate, wherein the second current conductor is formed with integrally attached first and second terminal leads, and comprises third electrical terminal leads and a semiconductor chip having an active surface with a magnetic field sensor and electronic circuits for the operation of the magnetic field sensor, the semiconductor chip mounted on the second current conductor, wherein
the first and second terminal leads protrude from the housing on a first side wall of the housing and the third terminal leads on a side wall of the housing opposite of the first side wall, and are bent off towards the substrate,
the semiconductor chip is mounted on the side of the second current conductor facing the substrate,
electrical terminals of the semiconductor chip are connected via bonding wires to the third terminal leads,
the magnetic field sensor is sensitive to a component of the magnetic field extending parallel to the active surface of the semiconductor chip and perpendicular to the second current conductor,
the second current conductor extends above and parallel to the first current conductor, wherein in operation a first current to be measured flows through the first current conductor and a second current to be measured flows through the second current conductor.

According to a first aspect, the first current to be measured and the second current to be measured are the same current, and the second current conductor is electrically connected to the second terminal leads in such a way that the current to be measured flows through the first current conductor and in the opposite direction through the second current conductor.

Preferably, the substrate comprises at least one further current conductor which is connected in series with the first current conductor in such a way that the current to be measured flows in the same direction through the first current conductor and the at least one further current conductor.

According to a second aspect, the device is configured in such a way that in operation the first current to be measured flows in a predetermined direction through the first current conductor and the second current to be measured flows in the same direction through the second current conductor, so that the magnetic field generated by the first current and the magnetic field generated by the second current point in opposite directions at the location of the magnetic field sensor, and that a width and a distance of the first current conductor from the magnet field sensor and a width and a distance of the second current conductor from the magnetic field sensor are adjusted to each other in such a way that the magnetic field generated by the first current and the magnetic field generated by the second current are equally strong with respect to their amount at the location of the magnetic field sensor at the same strength of the two currents.

Preferably, a magnetic shielding is attached on the side of the second current conductor opposite of the semiconductor chip.

Preferably, the magnetic field sensor comprises at least one magnetic field concentrator and at least one Hall element, wherein the Hall element is either a horizontal Hall element which is arranged in the region of the edge of the magnetic field concentrator beneath the magnetic field concentrator, or a vertical Hall element which is arranged in the region of the edge of the magnetic field concentrator adjacent to the magnetic field concentrator.

Alternativly, the magnetic field sensor is an AMR or a GMR or a fluxgate sensor.

Preferably, a ceramic plate is arranged between the semiconductor chip and the second current conductor of the current sensor, which ceramic plate is used as an electrical insulator.

In one embodiment, the ceramic plate protrudes beyond the semiconductor chip on all four sides by at least 0.1 mm.

In another embodiment, the ceramic plate protrudes beyond the semiconductor chip on all four sides by at least 0.4 mm.

BRIEF DESCRIPTION OF THE DRAWING FIGURES

Figure 1:
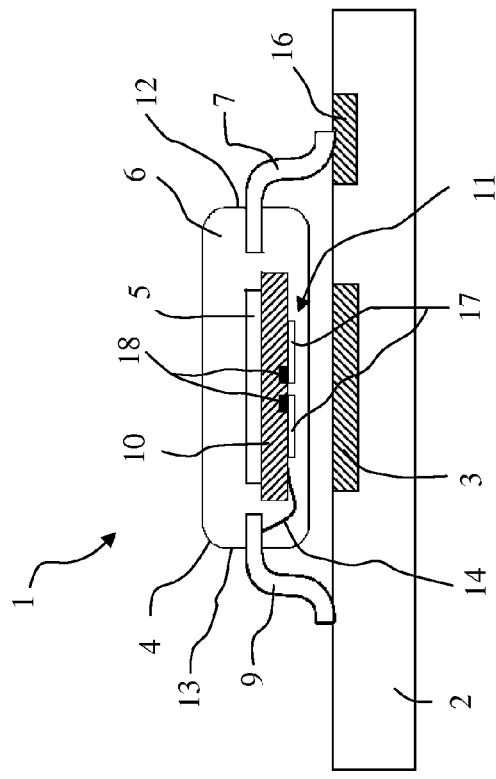
Figure 3:
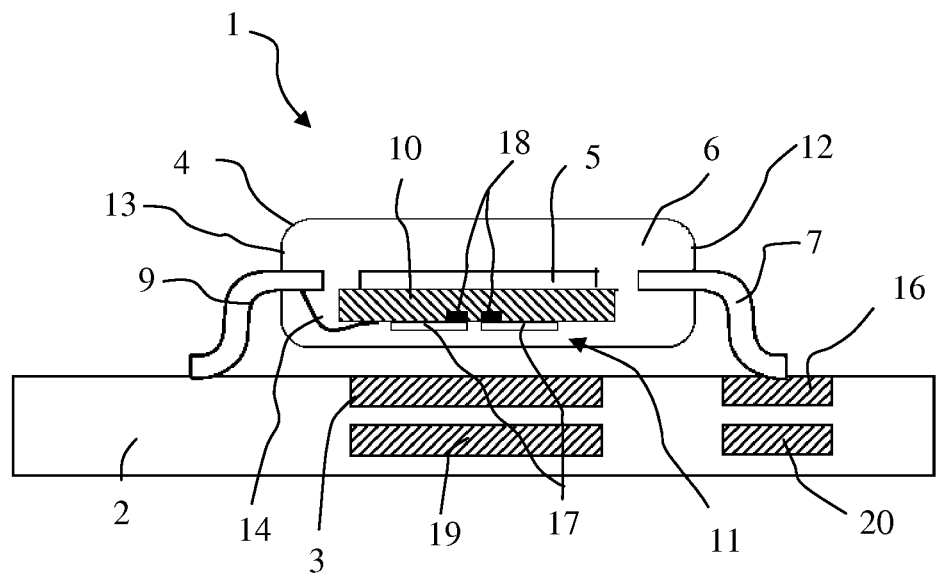
Figure 4:
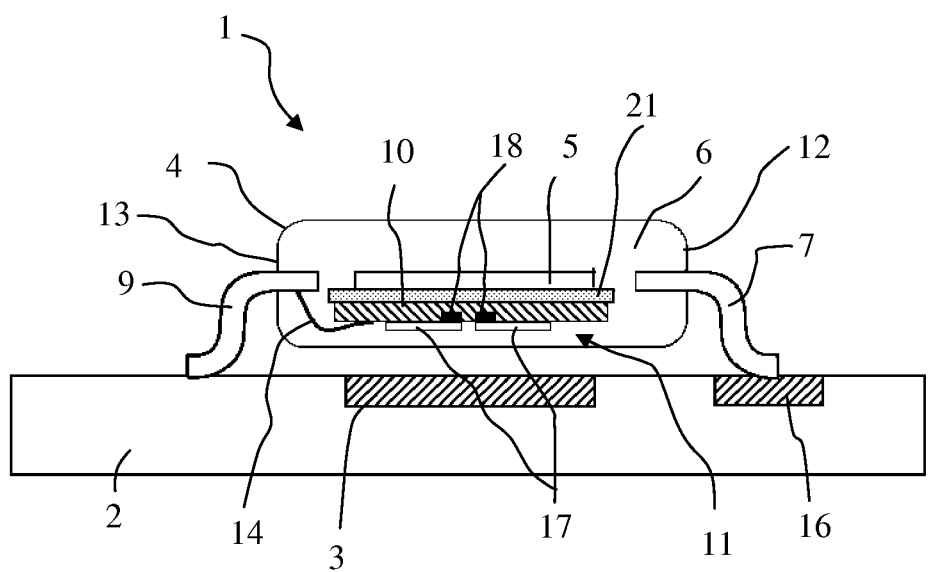
Figure 5:
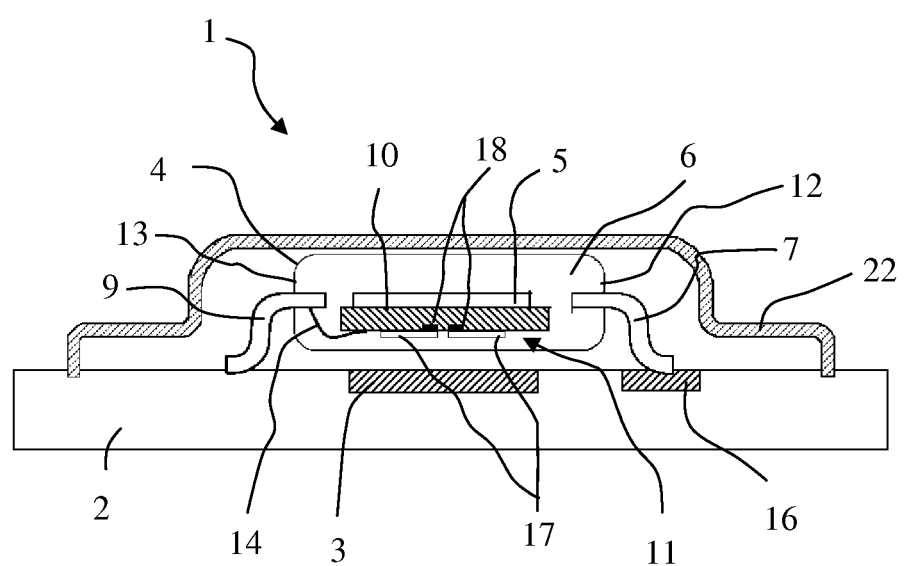

The accompanying drawings, which are incorporated into and constitute a part of this specification, illustrate one or more embodiments of the present invention and, together with the detailed description, serve to explain the principles and implementations of the invention. The figures are not to scale. In the drawings:

FIGS. 1 and 2 show a cross-sectional and top view of an embodiment of a device for current measurement in accordance with the invention, FIGS. 3 and 4 show a cross-sectional view of further embodiments of a device for current measurement in accordance with the invention, and FIG. 5 shows a device in accordance with the invention which is additionally provided with a magnetic shielding.

DETAILED DESCRIPTION OF THE INVENTION

FIGS. 1 and 2 show a cross-sectional and top view of an embodiment of a device 1 for current measurement in accordance with the invention. The device 1 comprises a substrate 2 with a first current conductor 3 and a current sensor 4 with a second current conductor 5. The current sensor 4 is encased in an IC housing 6, e.g. in an SOIC-8 or SOIC-16 housing, and mounted on the substrate 2 above the first current conductor 3. The current sensor 4 comprises the second current conductor 5 which is formed with integrally attached first and second electrical terminals leads 7 and 8, by means of which the current to be measured is supplied and discharged, and third electrical terminal leads 9, as well as a semiconductor chip 10 which is mounted on the second current conductor 5 on the side facing the substrate 2. The semiconductor chip 10 has an active surface with a magnetic field sensor 11 and electronic circuits for the operation of the magnetic field sensor. The first and second terminal leads 7 and 8 protrude out of the housing 6 from a first side wall 12 of the housing 6 and the third terminal leads 9 from a side wall 13 of the housing 6 which is opposite of the side wall 12 and are bent off towards the substrate 2. Electrical terminals of the semiconductor chip 10 are connected via bonding wires 14 to the third terminal leads 9. The current sensor 4 is aligned and mounted on the substrate 2 in such a way that the first current conductor 3 and the second current conductor 5 extend in parallel with respect to each other and substantially lie one on top of the other at a distance from each other. The two current conductors 3 and 5 are electrically connected to each other in such a way that the current to be measured in the two current conductors 3 and 5 flows in opposite directions. The magnetic field sensor is sensitive to the component of the magnetic field which extends parallel to the active surface of the semiconductor chip 10, and therefore also parallel to the surface of the substrate 2, and perpendicularly to the two current conductors 3 and 5.

The substrate 2 comprises several conducting paths, which are used to guide the current to be measured to the current sensor 4 and through the first current conductor 3, to supply the current sensor 4 with electrical power and guide the output signal of the current sensor 4 to a suitable location. The first current conductor 3 is part of such a conducting path 15, which is additionally formed in such a way that the terminal leads 8 make contact with the conducting path 15. The current to be measured is guided through a conducting path 16 to the first terminal leads 7, flows through the second current conductor 5 in the current sensor 4, and then through the terminal leads 8 to the conducting path 15 and through the first current conductor 3. The magnetic field which is produced at the location of the magnetic field sensor when the current flows through the first current conductor 3 and the magnetic field which is produced at the location of the magnetic field sensor when the current flows through the second current conductor 5 show in the same direction and therefore add up.

As is shown in the drawing, the magnetic field sensor is preferably a magnetic field sensor as known from U.S. Pat. No. 5,942,895. Such a magnetic field sensor comprises two magnetic field concentrators 17, which are separated by a narrow gap, and two horizontal Hall elements 18 (or clusters of Hall elements), which are arranged on both sides of the gap beneath the edge of the magnetic field concentrators 17, or a vertical Hall element which is arranged in the gap between the magnetic field concentrators 17. The magnetic field sensor can also be an AMR (anisotropic magnetoresistive sensor) or a GMR (giant magnetoresistive sensor) or a fluxgate sensor or any other magnetic sensor.

The device for current measurement in accordance with the invention is characterized in that the current to be measured firstly flows through a current conductor which is part of a current sensor and secondly through a current conductor which is arranged beneath the current sensor, wherein the two current conductors extend in parallel with respect to each other. The magnetic field generated by the current to be measured is thus increased at the location of the magnetic field sensor.

It is also possible to provide at least one further current conductor 19, which extends in parallel to the first current conductor 3 and is arranged adjacent to or beneath the first current conductor 3. The at least one further current conductor 19 is connected in series with the first current conductor 3 in such a way that the current to be measured flows in the same direction through the first current conductor 3 and the at least one further current conductor 19. The connections necessary for this purpose are guided around the current sensor 4 in such a way that they do not generate a magnetic field at the location of the magnetic field sensor, or only one that is comparatively very small.

The substrate 2 is especially a printed circuit board. Currently, such printed circuit boards often comprise several metallization planes. In this case it may be useful to provide a further current conductor 19 in at least one further metallization plane, which current conductor 19 extends parallel to the first current conductor 3. The at least one further current conductor 19 and the first current conductor 3 are connected in series one after the other and are connected to each other by conducting paths 20 in such a way that in the first current conductor 3 and in all further current conductors 19 the current to be measured flows in the same direction. In other words, the first current conductor 3 and the further current conductors 19 form a coil. Such a device for current measurement is shown in a cross-sectional view in FIG. 3.

FIG. 4 shows a cross-sectional view of a device 1 for current measurement in accordance with the invention, in which a ceramic plate 21 is arranged between the semiconductor chip 10 and the second current conductor 5 of the current sensor 4, which ceramic plate is used as an electrical insulator. The ceramic plate 21 protrudes beyond the semiconductor chip 10 on all four sides by at least 0.1 mm, preferably by at least 0.4 mm. The thickness of the ceramic plate 21 is typically 0.4 mm or more. This leads to a high dielectric strength between the semiconductor chip 10 and the second current conductor 5.

A magnetic shielding 22 can optionally be provided on the side of the second current conductor 5, which is opposite of the semiconductor chip 10. Such an embodiment is shown in the drawing. The magnetic shielding 22 is used to shield the magnetic field sensor 11 against a magnetic field extending parallel to the active surface of the semiconductor chip 10, and therefore also parallel to the surface of the substrate 2, and perpendicularly to the two current conductors 3 and 5.

The shielding 22 can be integrated in the housing 6 of the current sensor 4, or it can be a separate ferromagnetic component.

The device 1 for current measurement in accordance with the invention can also be used in a modified form to measure the difference of two currents. The modification is that the first current conductor 3 on the substrate 2 and the second current conductor 5 of the current sensor 4 are electrically not connected to each other. In operation, the first current to be measured flows in a predetermined direction through the first current conductor 3 and the second current to be measured flows in the same direction through the second current conductor 5. The magnetic field sensor 11 measures the difference between the magnetic field generated by the first current and the magnetic field generated by the second current, since these two magnetic fields point in opposite directions at the location of the magnetic field sensor 11. In order to ensure that the difference of the two magnetic fields also corresponds to the difference of the two currents, the magnetic field produced by the first current must be as strong with respect to its amount as the magnetic field produced by the second current at the location of the magnetic field sensor 11 in the case of equal strength of the two currents. This can be achieved in the following ways, which are applied individually or in combination depending on the respective possibilities:

- Arrangement of the first current conductor 3 on or in the substrate 2 in such a way that the distance of the first current conductor 3 from the magnetic field sensor 11 is equally large as the distance of the second current conductor 5 from the magnetic field sensor 11. The two current conductors 3 and 5 also have the same width and lie on top of each other.
- Mutual adjustment of the widths of the first current conductor 3 and the distance of the first current conductor 3 from the magnetic field sensor 11 and the width of the second current conductor 5 and the distance of the second current conductor 5 from the magnetic field sensor 11.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. Device for current measurement, comprising
   a substrate with a first current conductor, and
   a current sensor with a second current conductor, wherein
      the current sensor
         is configured to measure a sum of or a difference between a first current flowing through the first current conductor and a second current flowing through the second current conductor,
         is encased in an IC (integrated circuit) housing and is mounted above the first current conductor on the substrate, wherein the second current conductor is formed with integrally attached first and second terminal leads, and comprises third electrical terminal leads and a semiconductor chip having an active surface with a magnetic field sensor and electronic circuits for the operation of the magnetic field sensor, the semiconductor chip mounted on the second current conductor, wherein
      the first and second terminal leads protrude from the housing on a first side wall of the housing and the third terminal leads on a side wall of the housing opposite of the first side wall, and are bent off towards the substrate,
      the semiconductor chip is mounted on the side of the second current conductor facing the substrate,
      electrical terminals of the semiconductor chip are connected via bonding wires to the third terminal leads,
      the magnetic field sensor is sensitive to a component of the magnetic field extending parallel to the active surface of the semiconductor chip and perpendicular to the second current conductor,
      the second current conductor extends above and parallel to the first current conductor, so that a magnetic field produced by the current flowing through the first current conductor and a magnetic field produced by the current flowing through the second current conductor are sensed by the magnetic field sensor.

2. Device according to claim 1, wherein the first current to be measured and the second current to be measured are the same current, and wherein the second current conductor is electrically connected to the second terminal leads in such a way that the current to be measured flows through the first current conductor and in the opposite direction through the second current conductor.

3. Device according to claim 2, wherein the substrate comprises at least one further current conductor which is connected in series with the first current conductor in such a way that the current to be measured flows in the same direction through the first current conductor and the at least one further current conductor.

4. Device according to claim 1, wherein the device is configured in such a way that in operation the first current to be measured flows in a predetermined direction through the first current conductor and the second current to be measured flows in the same direction through the second current conductor, so that the magnetic field generated by the first current and the magnetic field generated by the second current point in opposite directions at the location of the magnetic field sensor, and that a width and a distance of the first current conductor from the magnet field sensor and a width and a distance of the second current conductor from the magnetic field sensor are adjusted to each other in such a way that the magnetic field generated by the first current and the magnetic field generated by the second current are equally strong with respect to their amount at the location of the magnetic field sensor if the two currents are of the same strength.

5. Device according to claim 1, wherein a magnetic shielding is attached on the side of the second current conductor opposite of the semiconductor chip.

6. Device according to claim 2, wherein a magnetic shielding is attached on the side of the second current conductor opposite of the semiconductor chip.

7. Device according to claim 3, wherein a magnetic shielding is attached on the side of the second current conductor opposite of the semiconductor chip.

8. Device according to claim 4, wherein a magnetic shielding is attached on the side of the second current conductor opposite of the semiconductor chip.

9. Device according to claim 1, wherein the magnetic field sensor comprises at least one magnetic field concentrator and at least one Hall element, wherein the Hall element is either a horizontal Hall element which is arranged in the region of the edge of the magnetic field concentrator beneath the magnetic field concentrator, or a vertical Hall element which is arranged in the region of the edge of the magnetic field concentrator adjacent to the magnetic field concentrator.

10. Device according to claim 2, wherein the magnetic field sensor comprises at least one magnetic field concentrator and at least one Hall element, wherein the Hall element is either a horizontal Hall element which is arranged in the region of the edge of the magnetic field concentrator beneath the magnetic field concentrator, or a vertical Hall element which is arranged in the region of the edge of the magnetic field concentrator adjacent to the magnetic field concentrator.

11. Device according to claim 4, wherein the magnetic field sensor comprises at least one magnetic field concentrator and at least one Hall element, wherein the Hall element is either a horizontal Hall element which is arranged in the region of the edge of the magnetic field concentrator beneath the magnetic field concentrator, or a vertical Hall element which is arranged in the region of the edge of the magnetic field concentrator adjacent to the magnetic field concentrator.

12. Device according to claim 1, wherein the magnetic field sensor is one of:
an AMR (anisotropic magnetoresistive) sensor, a GMR (giant magnetoresistive) sensor, and a fluxgate sensor.

13. Device according to claim 1, wherein a ceramic plate is arranged between the semiconductor chip and the second current conductor of the current sensor.

14. Device according to claim 13, wherein the ceramic plate protrudes beyond the semiconductor chip on all four sides by at least 0.1 mm.

15. Device according to claim 13, wherein the ceramic plate protrudes beyond the semiconductor chip on all four sides by at least 0.4 mm.

16. Device according to claim 2, wherein a ceramic plate is arranged between the semiconductor chip and the second current conductor of the current sensor.

17. Device according to claim 16, wherein the ceramic plate protrudes beyond the semiconductor chip on all four sides by at least 0.1 mm.

18. Device according to claim 16, wherein the ceramic plate protrudes beyond the semiconductor chip on all four sides by at least 0.4 mm.

19. Device according to claim 9, wherein a ceramic plate is arranged between the semiconductor chip and the second current conductor of the current sensor.

20. Device according to claim 19, wherein the ceramic plate protrudes beyond the semiconductor chip on all four sides by at least 0.1 mm.

21. Device according to claim 19, wherein the ceramic plate protrudes beyond the semiconductor chip on all four sides by at least 0.4 mm.

* * * * *